US00RE50125E

(19) United States
(12) Reissued Patent
Kim et al.

(10) Patent Number: US RE50,125 E
(45) Date of Reissued Patent: Sep. 10, 2024

(54) DISPLAY DEVICE

(71) Applicant: LG Display Co., Ltd., Seoul (KR)

(72) Inventors: HeeYeol Kim, Paju-si (KR); Hongseok Choi, Seoul (KR)

(73) Assignee: LG DISPLAY CO., LTD., Seoul (KR)

(21) Appl. No.: 17/865,176

(22) Filed: Jul. 14, 2022

Related U.S. Patent Documents

Reissue of:
(64) Patent No.: 10,714,540
Issued: Jul. 14, 2020
Appl. No.: 16/225,254
Filed: Dec. 19, 2018

(30) Foreign Application Priority Data

Dec. 27, 2017 (KR) ..... 10-2017-0180684

(51) Int. Cl.

| | |
|---|---|
| ***H01L 27/32*** | (2006.01) |
| ***G02B 5/20*** | (2006.01) |
| ***H01L 51/52*** | (2006.01) |
| ***H10K 50/854*** | (2023.01) |
| ***H10K 50/86*** | (2023.01) |
| ***H10K 59/38*** | (2023.01) |
| *H10K 59/12* | (2023.01) |

(52) U.S. Cl.
CPC ..... *H10K 59/38* (2023.02); *H10K 50/854* (2023.02); *H10K 50/86* (2023.02); *G02B 5/20* (2013.01); *H10K 50/865* (2023.02); *H10K 59/12* (2023.02)

(58) Field of Classification Search
CPC ..... H01L 27/322; H01L 51/5268; H01L 51/5281; H01L 27/3244; H01L 51/5284; G02B 5/20
See application file for complete search history.

(56) References Cited

U.S. PATENT DOCUMENTS

| | | | |
|---|---|---|---|
| 2007/0200492 | A1 | 8/2007 | Cok et al. |
| 2008/0042146 | A1 | 2/2008 | Cok et al. |
| 2011/0042697 | A1 | 2/2011 | Lee et al. |
| 2015/0255520 | A1 | 9/2015 | Seo et al. |

(Continued)

FOREIGN PATENT DOCUMENTS

| | | | |
|---|---|---|---|
| JP | 2016-122606 | A | 7/2016 |
| KR | 10-1110072 | B1 | 2/2012 |
| KR | 10-1375331 | B1 | 3/2014 |

(Continued)

OTHER PUBLICATIONS

Translation of JP-2016-122606 (Year: 2016).*
European Office Action issued in European Patent Application No. 18 212 297.8, dated Sep. 24, 2021.

*Primary Examiner* — Ling X Xu
(74) *Attorney, Agent, or Firm* — Birch, Stewart, Kolasch & Birch, LLP

(57) ABSTRACT

A display device can include an organic light emitting diode disposed in a first pixel configured to emit a first color light, a second pixel configured to emit a second color light, and a third pixel configured to emit a third color light, in which the organic light emitting diode emits the third color light; a first color-conversion layer disposed on the organic light emitting diode in the first pixel; and a second color-conversion layer disposed on the organic light emitting diode in the second pixel, in which the first color light and the second color light have a longer wavelength than the third color light.

59 Claims, 6 Drawing Sheets

(56) References Cited

U.S. PATENT DOCUMENTS

| | | | |
|---|---|---|---|
| 2016/0163768 | A1 | 6/2016 | Song et al. |
| 2017/0240728 | A1 | 8/2017 | Lee et al. |

FOREIGN PATENT DOCUMENTS

| | | | |
|---|---|---|---|
| KR | 10-1475118 | B1 | 12/2014 |
| KR | 10-2017-0026950 | A | 3/2017 |
| KR | 10-2017-0080923 | A | 7/2017 |
| WO | WO 2011/145418 | A1 | 11/2011 |

* cited by examiner

DISPLAY DEVICE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

[This application claims the priority benefit of Korean Patent Application No. 10-2017-0180684 filed on Dec. 27, 2017, in the Republic of Korea, the entirety of which is incorporated herein by reference.]

*This Application is a Reissue application of U.S. Pat. No. 10,714,540 issued on Jul. 14, 2020, which claims the priority benefit of Korean Patent Application No. 10-2017-0180684 filed on Dec. 27, 2017, in the Republic of Korea, all of these applications are hereby expressly incorporated by reference into the present application.*

BACKGROUND

Field

The present disclosure relates to a display device, and more particularly, to a display device with improved light efficiency, reduced external light reflection, and reduced thickness.

Description of the Related Art

Recently, as society enters further into an information society, a display field which visually represents an electrical information signal is rapidly being developed. In accordance with this rapid development, various flat display devices having excellent performance and excellent characteristics, such as thin thickness, light weight, and low power consumption properties have been developed and have rapidly replaced cathode ray tube (CRT) displays that have been used in the art.

Specific examples of the above-mentioned flat display device may include a liquid crystal display device (LCD), an organic light emitting display device (OLED), an electrophoretic display device (EPD), a plasma display panel device (PDP), and an electro-wetting display device (EWD), and the like.

A display device may include a color filter, and the color filter transmits only light having a specific wavelength band among light incident from one side. Therefore, light entering one side of the color filter may decrease in intensity while passing through the color filter. Thus, the light efficiency of the display device may be reduced.

The display device may further include a polarizer to reduce external light reflection. Light incident into the display device from the outside may be reflected inside the display device and then emitted to the outside. Thus, without a polarizer, the shape of an external object is reflected on a surface of the display device. The polarizer of the display device is configured to polarize light incident into the display device. And the polarized light may be reflected inside the display device and then phase-shifted. The polarizer may protect the phase-shifted light from being emitted back to the outside of the display device, and, thus, external light reflection can be prevented. However, the thickness of the display device may be increased and the light efficiency of the display device may be reduced due to the presence of the polarizer.

SUMMARY

An object to be achieved by the present disclosure is to provide a display device which includes an organic light emitting diode that generates a monochromatic light and a color-conversion layer and thus has an improved light efficiency.

Further, another object to be achieved by the present disclosure is to provide a display device in which a color filter configured to transmit a monochromatic light generated by an organic light emitting diode is disposed under a color-conversion layer to reduce external light reflection without a polarizer.

Yet another object to be achieved by the present disclosure is to provide a display device in which color filters corresponding to colors of light generated by pixels are disposed in the pixels, respectively, to further improve the color purity.

Objects of the present disclosure are not limited to the above-mentioned objects, and other objects, which are not mentioned above, can be clearly understood by those skilled in the art from the following descriptions.

According to an aspect of the present disclosure, there is provided a display device that includes an organic light emitting diode which is disposed in a first pixel configured to emit a first color light, a second pixel configured to emit a second color light, and a third pixel configured to emit a third color light and emits the third color light. The display device further includes a first color-conversion layer disposed on the organic light emitting diode in the first pixel. The display device further includes a second color-conversion layer disposed on the organic light emitting diode in the second pixel. Accordingly, it is possible to reduce a difference in intensity between light generated by the organic light emitting diode and light generated by each pixel and thus increase the light efficiency of the display device.

According to another aspect of the present disclosure, there is provided a display device that includes a blue organic light emitting diode disposed in a red pixel, a green pixel, and a blue pixel. The display device further includes a red color-conversion layer which is disposed on the blue organic light emitting diode in the red pixel and converts a blue light emitted from the blue organic light emitting diode into a red light. The display device further includes a green color-conversion layer which is disposed on the blue organic light emitting diode in the green pixel and converts a blue light emitted from the blue organic light emitting diode into a green light. Accordingly, it is possible to reduce the thickness of the display device and improve the light efficiency of the display device.

Other detailed matters of the embodiments are included in the detailed description and the drawings.

According to the present disclosure, a display device includes a light source configured to emit a monochromatic light and a color-conversion layer. Thus, the light efficiency of the display device can be improved.

Further, according to the present disclosure, a display device includes a color filter overlapping with a color-conversion layer. Thus, external light reflection can be reduced and a polarizer may not be used. Therefore, the light efficiency of the display device can be improved.

Furthermore, according to the present disclosure, a display device includes color filters, which transmit only light of a specific wavelength band, but do not transmit light in other wavelength bands, on a color-conversion layer. Thus, the color purity of the display device can be improved.

The effects according to the present disclosure are not limited to the contents above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
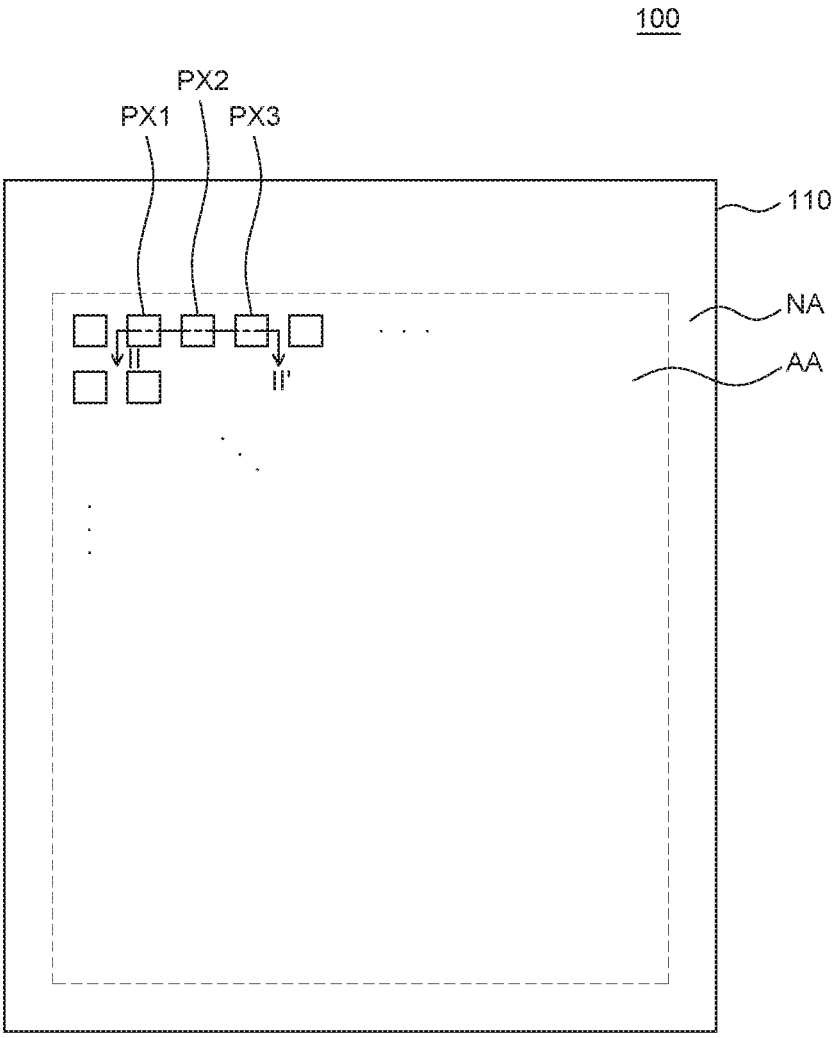
FIG. 1 is a plan view of a display device according to an embodiment of the present disclosure.

Advantages and characteristics of the present disclosure and a method of achieving the advantages and characteristics will be clear by referring to example embodiments described below in detail together with the accompanying drawings. However, the present disclosure is not limited to embodiments disclosed herein but will be implemented in various forms. The embodiments are provided by way of example only so that a person of ordinary skilled in the art can fully understand the present disclosure and the scope of the present disclosure. Therefore, the present disclosure will be defined only by the scope of the appended claims.

The shapes, sizes, ratios, angles, numbers, and the like illustrated in the accompanying drawings illustrating embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having." and "comprising" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used illustrating various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways as understood by those skilled in the art, and the embodiments can be performed independently of or in association with each other.

Hereinafter, various embodiments of the present disclosure will be described in detail with reference to accompanying drawings.

Figure 2:
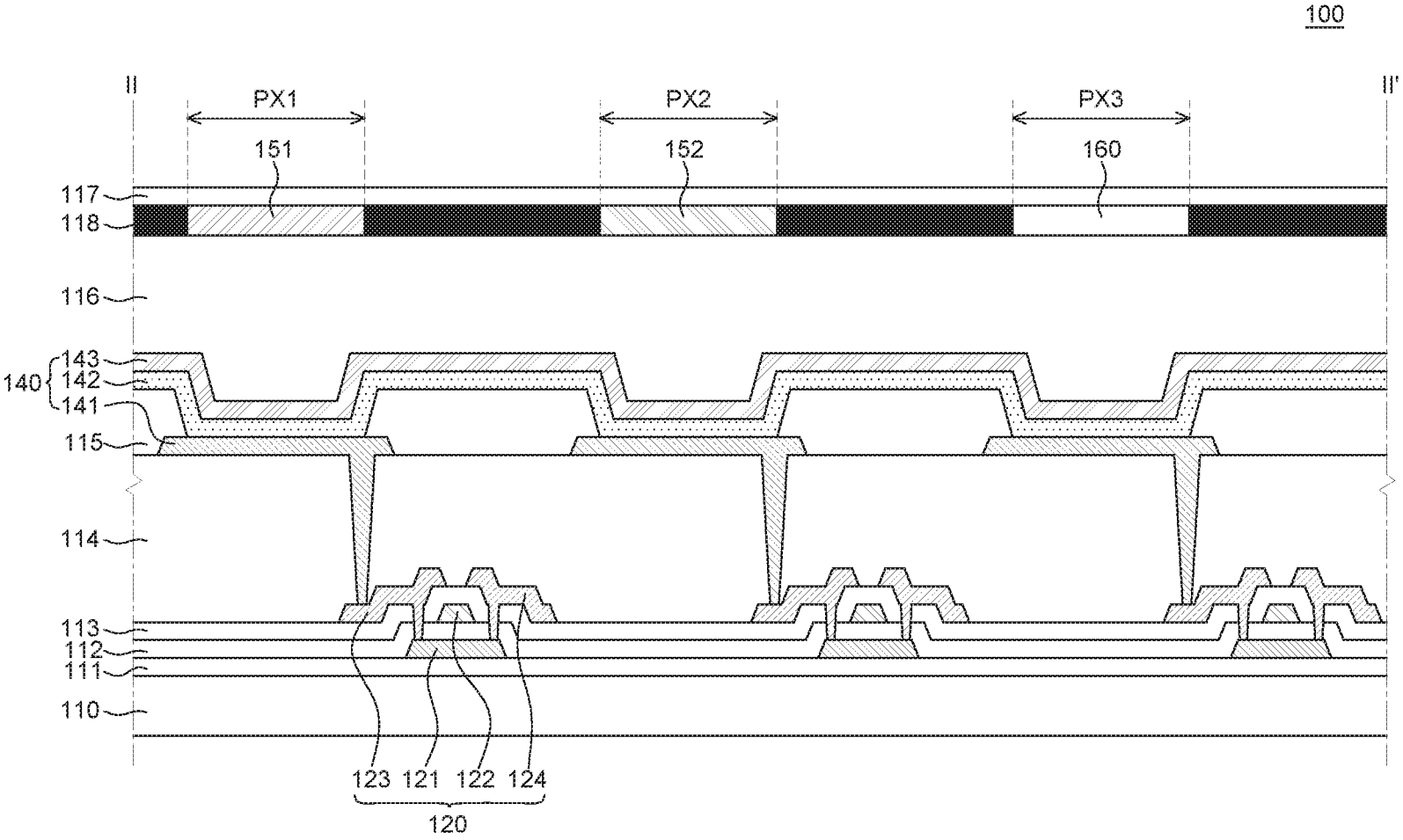
FIG. 2 is a cross-sectional view taken along a line II-II' of FIG. 1 according to an embodiment of the present disclosure.

FIG. 1 is a plan view of a display device according to an embodiment of the present disclosure. FIG. 2 is a cross-sectional view taken along a line II-II' of FIG. 1. FIG. 1 illustrates only a first substrate 110 and a plurality of pixels PX1, PX2 and PX3 for convenience in explanation.

Referring to FIG. 1 and FIG. 2, the first substrate 110 supports various components of a display device 100. The first substrate 110 can be formed of glass or a plastic material having flexibility. The first substrate 110 can be formed of a plastic material such as polyimide (PI).

Referring to FIG. 1, the first substrate 110 includes an active area AA and a non-active area NA. The active area AA refers to an area where an organic light emitting diode 140 is disposed and an image is actually displayed. The non-active area NA, as an outer area surrounding the active area AA, refers to an area where an image is not displayed and various driving components for driving the organic light emitting diode 140 are disposed.

Referring to FIG. 1 and FIG. 2, the plurality of pixels PX1, PX2, and PX3 disposed in a matrix form can be defined in the active area AA of the first substrate 110. As illustrated in FIG. 2, the plurality of pixels PX1, PX2, and PX3 can include a first pixel PX1, a second pixel PX2, and a third pixel PX3. The first pixel PX1, the second pixel PX2, and the third pixel PX3 can correspond to a red pixel, a green pixel, and a blue pixel, respectively. Specifically, the first pixel PX1 can be configured to emit a first color light which is a red light and the second pixel PX2 can be configured to emit a second color light which is a green light. Further, the third pixel PX3 can be configured to emit a third color light which is a blue light.

Herein, the first color light and the second color light can have a longer wavelength than the third color light. The first color light can have a wavelength of from 600 nm to 640 nm and can be a red light. The second color light can have a wavelength of from 520 nm to 580 nm and can be a green light. Further, the third color light can have a wavelength of from 400 nm to 480 nm and can be a blue light. Therefore, the first color light and the second color light can have a longer wavelength than the third color light.

A buffer layer 111 is formed on the first substrate 110 to protect various components of the display device 100 against infiltration of moisture ($H_2O$) and hydrogen ($H_2$) from the outside of the first substrate 110. The buffer layer 111 can be formed of an insulating material and can include one or more inorganic layers formed of, for example, silicon nitride (SiNx), silicon oxide (SiOx), silicon oxynitride (SiON), or the like. Herein, the buffer layer 111 may be omitted depending on the structure or characteristics of the display device 100.

A transistor 120 including a gate electrode 122, an active layer 121, a source electrode 123, and a drain electrode 124 is formed on the buffer layer 111. For example, the active layer 121 is formed on the buffer layer 111 and a gate insulating layer 112 for insulating the active layer 121 from the gate electrode 122 is formed on the active layer 121. An interlayer insulating layer 113 for insulating the gate electrode 122 from the source electrode 123 and the drain electrode 124 is formed, and the source electrode 123 and the drain electrode 124 each in contact with the active layer 121 are formed on the interlayer insulating layer 113.

FIG. 2 illustrates only a driving transistor as one of various transistors 120 which can be included in the display device 100, for convenience in explanation. Herein, a switching transistor, a capacitor, and the like can be included in the display device 100. Further, in the present specification, the transistor 120 is illustrated as having a coplanar structure, but various transistors having a staggered structure or the like can be used.

An overcoating layer 114 is formed on the transistor 120. The overcoating layer 114 flattens an upper part of the transistor 120. The overcoating layer 114 can include one or more layers and can be formed of an organic material. For example, the overcoating layer 114 can be formed of an acryl-based organic material, but may not be limited thereto. The overcoating layer 114 includes contact holes for electrically connecting the transistor 120 and an anode 141.

In some example embodiments, a passivation layer can be formed between the transistor 120 and the overcoating layer 114. The passivation layer can be formed of an inorganic material and can include one or more layers, but may not be limited thereto.

The organic light emitting diode 140 is disposed on the overcoating layer 114. The organic light emitting diode 140 is configured to emit the third color light of a specific wavelength band (e.g., blue monochromatic light). That is, the organic light emitting diode 140 can be a blue organic light emitting diode configured to emit the third color light which is a blue light. For example, the third color light emitted by the organic light emitting diode 140 can have a wavelength band of from 400 nm to 480 nm. The organic light emitting diode 140 is disposed to correspond to each of the first pixel PX1, the second pixel PX2, and the third pixel PX3.

The organic light emitting diode 140 includes the anode 141, an organic emission layer 142, and a cathode 143. Specifically, the anode 141 is disposed on the overcoating layer 114. The anode 141 is an electrode configured to supply holes to the organic emission layer 142. The anode 141 can be formed of a transparent conductive material having a high work function. Herein, the transparent conductive material can include indium tin oxide (ITO), indium zinc oxide (IZO), or indium tin zinc oxide (ITZO). Since the display device 100 is of top-emission type, the anode 141 can further include a reflecting plate.

The anode 141 is electrically connected to the transistor 120 through the contact holes in the overcoating layer 114. For example, FIG. 2 illustrates that the anode 141 is electrically connected to the source electrode 123 of the transistor 120, but the anode 141 can be electrically connected to the drain electrode 124. The anodes 141 are disposed as separated from each other for each pixel.

A bank 115 is formed on the anode 141 and the overcoating layer 114. The bank 115 is configured to distinguish adjacent pixels. The bank 115 can be disposed to cover at least a part of both sides of the adjacent anode 141 and expose a part of an upper surface of the anode 141. The bank 115 can function to suppress the emission of light by an unintended pixel or color mixing which occurs when a current is concentrated at the edge of the anode 141 and light is emitted in a lateral direction of the anode 141. The bank 115 can be formed of acryl-based resin, benzocyclobutene (BCB)-based resin, or polyimide, but may not be limited thereto.

The organic emission layer 142 is disposed on the anode 141 and the bank 115. The organic emission layer 142 is configured to emit the third color light. That is, the organic emission layer 142 can emit a blue light. The organic emission layer 142 can contain a luminescent material that emits a blue light. The luminescent material can contain a phosphorescent or a fluorescent material. Specifically, the organic emission layer 142 can contain a host material including CBP or mCP and can be formed of a phosphorescent material containing a dopant material including (4,6-F2ppy)2Irpic. Further, the blue emission layer can be formed of a fluorescent material including any one selected from the group consisting of spiro-DPVBi, spiro-6P, distyrylbenzene (DSB), distyrylarylene (DSA), a PFO-based polymer, and a PPV-based polymer, but may not be limited thereto.

The organic emission layer 142 can be formed as a single emission layer. Otherwise, the organic emission layer 142 can have a stack structure in which a plurality of emission layers is laminated with a charge generation layer therebetween. For example, if the organic emission layer 142 has two stacks, both a first emission layer and a second emission layer can emit a blue light. Further, the organic emission layer 142 can further include at least one of a hole transport layer, an electron transport layer, a hole block layer, an electron block layer, a hole injection layer, and an electron injection layer.

The organic emission layer 142 can be a common layer formed in the plurality of pixels PX1, PX2, and PX3. That is, as illustrated in FIG. 2, the organic emission layer 142 can be formed as a single layer on the bank 115 and the anode 141. Thus, the organic emission layer 142 can be formed continuously in the plurality of pixels PX1, PX2, and PX3 of the display device 100 (e.g., a common organic emission layer can be formed across the pixels). However, the organic emission layer 142 may not be limited thereto and can be formed as a plurality of layers disposed corresponding to the plurality of pixels PX1, PX2, and PX3, respectively.

The cathode 143 is disposed on the organic emission layer 142. The cathode 143 supplies electrons to the organic emission layer 142. The cathode 143 can be formed of indium tin oxide (ITO)-, indium zinc oxide (IZO)-, indium tin zinc oxide (ITZO), zinc oxide (ZnO), or tin oxide (TO)-based transparent conductive oxide or ytterbium (Yb) alloy. Otherwise, the cathode 143 can be formed of a metal material.

An optical compensation layer can be disposed on the cathode 143 of the organic light emitting diode 140 unlike being illustrated in FIG. 2. The optical compensation layer refers to a layer formed of an organic material and configured to compensate for the thickness of the cathode 143 and improve the light efficiency. If the thickness of the cathode 143 is decreased, the characteristics of light generated by the organic light emitting diode 140 may be changed. The optical compensation layer can be disposed on the cathode 143 to set the total thickness of the organic light emitting diode 140 to a specific thickness. Thus, it is possible to suppress a change in characteristics of light.

An encapsulation layer 116 is disposed on the organic light emitting diode 140. The encapsulation layer 116 protects the organic light emitting diode 140 against moisture, air or physical impact which may be infiltrated from the outside. The encapsulation layer 116 can have a structure in which inorganic layers and organic layers are laminated alternately.

A second substrate 117, a black matrix 118, a first color-conversion layer 151, a second color-conversion layer 152, and a transparent layer 160 are disposed on the encapsulation layer 116. The black matrix 118, the first color-conversion layer 151, the second color-conversion layer 152, and the transparent layer 160 can be formed under the second substrate 117. The second substrate 117 under which the black matrix 118, the first color-conversion layer 151, the second color-conversion layer 152, and the transparent layer 160 are disposed can be disposed on the encapsulation layer 116. The first substrate 110 and the second substrate 117 can be attached by pressurizing the first substrate 110 and the second substrate 117.

Specifically, the second substrate 117 supports various components disposed under the second substrate 117. Specifically, the second substrate 117 can support the black matrix 118, the first color-conversion layer 151, the second color-conversion layer 152, and the transparent layer 160 disposed under the second substrate 117. The second substrate 117 can be formed of the same material as the first substrate 110 and can be formed of, for example, polyimide (PI).

The black matrix 118 is disposed under the second substrate 117. The black matrix 118 is a black insulating layer and inhibits the components overlapping with the black matrix 118 from being seen from the outside of the display device 100. The black matrix 118 can be disposed between the plurality of pixels PX1, PX2, and PX3 to define the plurality of pixels PX1, PX2, and PX3. That is, the black matrix 118 can be disposed in the active area AA except the plurality of pixels PX1, PX2, and PX3 to define each of the plurality of pixels PX1, PX2, and PX3.

The first color-conversion layer 151 is disposed under the second substrate 117. The first color-conversion layer 151 is configured to convert a third color light generated by the organic light emitting diode 140 into a first color light. For example, the first color-conversion layer 151 can convert a blue light generated by the organic light emitting diode 140 into a red light. That is, the first color-conversion layer 151 can convert light having a wavelength of from 400 nm to 480 nm into light having a wavelength of from 600 nm to 640 nm.

The first color-conversion layer 151 is disposed on the organic light emitting diode 140 in the first pixel PX1. Further, a lateral surface of the first color-conversion layer 151 can be in contact with a lateral surface of the black matrix 118. Furthermore, a lower surface of the first color-conversion layer 151 can be in contact with the encapsulation layer 116. Due to the first color-conversion layer 151 disposed in the first pixel PX1, a red light can be emitted from the first pixel PX1.

The first color-conversion layer 151 can contain a filler and a first color-conversion material dispersed in the filler. The filler can be formed of a transparent epoxy material that can transmit light, but may not be limited thereto.

The first color-conversion material can be mixed and dispersed in the form of a compound in the filler of the first color-conversion layer 151. The first color-conversion material can receive a third color light generated by the organic light emitting diode 140 into a first color light. Specifically, the first color-conversion material can receive a blue light and convert the blue light into a red light and then emit the red light. That is, the blue light generated by the organic light emitting diode 140 can be incident into the first color-conversion layer 151. The blue light incident into the first color-conversion layer 151 can be converted into the red light by the first color-conversion material. The first color-conversion layer 151 contains the first color-conversion material and thus can emit the red light.

The first color-conversion material can be, for example, a material that emits light by the transition of excited electrons from a conduction band to a valence band. Thus, the first color-conversion material can convert light of a specific wavelength band into light of another wavelength band and then emit the converted light.

For example, the first color-conversion material can be formed of any one of DCM (4-(dicyanomethylene)-2-methyl-6-(4-dimethylaminostyryl)-4H-pyran), DCM2 (4-(dicyanomethylene)-2-methyl-6-(juloidin-4-yl-vinyl)-4H-pyran), DCJTB (4-(dicyanomethylene)-2-t-butyl-6-(1,1,7,7-tetramethyljuloidyl-9-ehyl)-4H-pyran), DCDDC (3-(dicyanomethylene)-5,5-dimethyl-1-[(4-dimethylamino) styryl]cyclohexene), AAAP (6-methyl-3-{3-(1,1,6,6-tetramethyl-10-oxo-2,3,5,6-tetrahydro-1H,4H,10H-11-oxa-3a-azabenzo[de]anthracence-9-yl)acryloyl}pyran-2,4-dione), and BSN (1,1'-dicyano-substituted bis-stylnaphthalene). Further, the first color-conversion material can be formed of an inorganic semiconductor material doped with a rare earth metal. More specifically, the first color-conversion material can be formed of GaN:Eu which is gallium nitride (GaN) doped with europium (Eu). Furthermore, the first color-conversion material can be formed of quantum dots that emit different colors of light depending on the size, but may not be limited thereto.

The second color-conversion layer 152 is disposed under the second substrate 117. The second color-conversion layer 152 is configured to convert a third color light generated by the organic light emitting diode 140 into a second color light. For example, the second color-conversion layer 152 can convert a blue light generated by the organic light emitting diode 140 into a green light and emit the green light. That is, the second color-conversion layer 152 may convert light having a wavelength of from 400 nm to 480 nm into light having a wavelength of from 520 nm to 580 nm.

The second color-conversion layer 152 is disposed on the organic light emitting diode 140 in the second pixel PX2. Further, a lateral surface of the second color-conversion layer 152 can be in contact with a lateral surface of the black matrix 118. Furthermore, a lower surface of the second color-conversion layer 152 can be in contact with the encapsulation layer 116. Due to the second color-conversion layer 152 disposed in the second pixel PX2, a green light can be emitted from the second pixel PX2.

Further, the second color-conversion layer 152 can contain a filler and a second color-conversion material dispersed in the filler. The filler can be formed of the same material as the filler contained in the first color-conversion layer 151. For example, the filler of the second color-conversion layer 152 can be formed of a transparent epoxy material that can transmit light, but may not be limited thereto.

The second color-conversion material can be mixed and dispersed in the form of a compound in the filler of the second color-conversion layer 152. The second color-conversion material can receive a third color light generated by the organic light emitting diode 140 into a second color light.

Specifically, the second color-conversion material can receive a blue light and convert the blue light into a green light and then emit the green light. That is, the blue light generated by the organic light emitting diode 140 can be incident into the second color-conversion layer 152. The blue light incident into the second color-conversion layer 152 can be converted into the green light by the second color-conversion material. The second color-conversion layer 152 contains the second color-conversion material and thus can emit the green light.

The second color-conversion material can be, for example, a material that emits light by the transition of excited electrons from a conduction band to a valence band. Thus, the second color-conversion material can convert light of a specific wavelength band into light of another wavelength band and then emit the converted light.

For example, the second color-conversion material may be formed of any one of Alq3 (tris(8-quinolinolato)aluminum)), C-545T (10-(2-bezothianzolyl)-1,1,7,7-tetramethyl-2,3,6,7-tetradro-H,5H,11H-[1]benzo-pyrano[6,7,8-ij]quinolizin-11-one), quinacridone derivatives, and carbazole derivatives. Further, the second color-conversion material can be formed of GaN:Eu which is gallium nitride (GaN) doped with europium (Eu), or the second color-conversion material can be formed of GaN:Er which is gallium nitride (GaN) doped with erbium (Er). Furthermore, the second color-conversion material can be formed of quantum dots that emit different colors of light depending on the size, but may not be limited thereto.

The transparent layer 160 is disposed under the second substrate 117. The transparent layer 160 is configured to transmit a third color light generated by the organic light emitting diode 140. The transparent layer 160 is disposed on the organic light emitting diode 140 in the third pixel PX3. Further, a lateral surface of the transparent layer 160 can be in contact with a lateral surface of the black matrix 118. Furthermore, a lower surface of the transparent layer 160 can be in contact with the encapsulation layer 116.

Specifically, the transparent layer 160 can be formed of transparent resin and thus can directly transmit light incident into the transparent layer 160. The transparent layer 160 disposed in the third pixel PX3 may transmit a blue light generated by the organic light emitting diode 140 and incident into the transparent layer 160. Thus, a blue light can be emitted from the third pixel PX3. In various exemplary embodiments, the transparent layer 160 is not formed at a position corresponding to the third pixel PX3 and the display device can be configured to directly transmit a blue light emitted from the third pixel PX3.

A related art display device can include an organic light emitting diode configured to emit a white light instead of an organic light emitting diode configured to emit a monochromatic light. The white light emitted from the organic light emitting diode is incident into a color filter containing a dye or pigment. And then red, green or blue monochromatic light is emitted through the color filter to the outside of the display device. The color filter may contain a dye or pigment and transmit only light of a specific wavelength band among light incident into the color filter. Therefore, the white light emitted from the organic light emitting diode may decrease in intensity while passing through the color filter. Thus, the light efficiency of the display device may be reduced.

In contrast, the display device 100 according to an embodiment of the present disclosure includes the organic light emitting diode 140, the first color-conversion layer 151, and the second color-conversion layer 152 and thus can increase the light efficiency of the display device 100. Specifically, the organic light emitting diode 140 can emit a third color light which is a monochromatic light, instead of a white light. That is, the organic light emitting diode 140 can generate a blue light. The blue light generated by the organic light emitting diode 140 can be incident into each of the first color-conversion layer 151 and the second color-conversion layer 152. The first color-conversion layer 151 and the second color-conversion layer 152 contain a first color-conversion material and a second color-conversion material, respectively. Herein, a color-conversion material can convert light of a specific wavelength band into light of another wavelength band or emit light by itself. The first color-conversion material can convert a blue light into a red light, and the second color-conversion material can convert a blue light into a green light. Unlike the color filter that transmits only light of a specific wavelength band among incident light of total wavelength band, the first color-conversion layer 151 and the second color-conversion layer 152 can convert total wavelength band of incident light and directly emit the incident light. A difference in intensity between a blue light generated by the organic light emitting diode 140 and red and green lights generated by the first color-conversion layer 151 and the second color-conversion layer 152, respectively, can be reduced. Therefore, the light efficiency of the display device 100 according to an embodiment of the present disclosure can be increased.

Further, the blue light generated by the organic light emitting diode 140 can be incident into the transparent layer 160 disposed in the third pixel PX3 and transmitted directly. Unlike the color filter that transmits only light of a specific wavelength band among incident light, the transparent layer 160 can suppress a decrease in intensity of light which may occur when the blue light passes through the transparent layer 160. Therefore, the light efficiency of the display device 100 according to an embodiment of the present disclosure can be increased.

The display device 100 illustrated in FIG. 1 and FIG. 2 is of top-emission type, and, thus, light emitted from the organic light emitting diode 140 is emitted to the upper side of the display device 100. However, the display device 100 can also be of bottom-emission type. The bottom-emission type display device refers to a display device in which light emitted from an organic light emitting diode is emitted to the lower side of the display device. In this instance, the light emitted from the organic light emitting diode is emitted toward a lower surface of the first substrate on which the transistor is formed. Further, the light emitted from the organic light emitting diode is emitted to the lower side of the organic light emitting diode, and the anode does not include the reflecting plate. The cathode can include the reflecting plate or can be formed of a metal material.

In the bottom-emission type display device, the first color-conversion layer can be disposed between the interlayer insulating layer and the overcoating layer in the first pixel. Further, the second color-conversion layer can be disposed between the interlayer insulating layer and the overcoating layer in the second pixel. Furthermore, the transparent layer can be disposed between the interlayer insulating layer and the overcoating layer in the third pixel.

Figure 3:
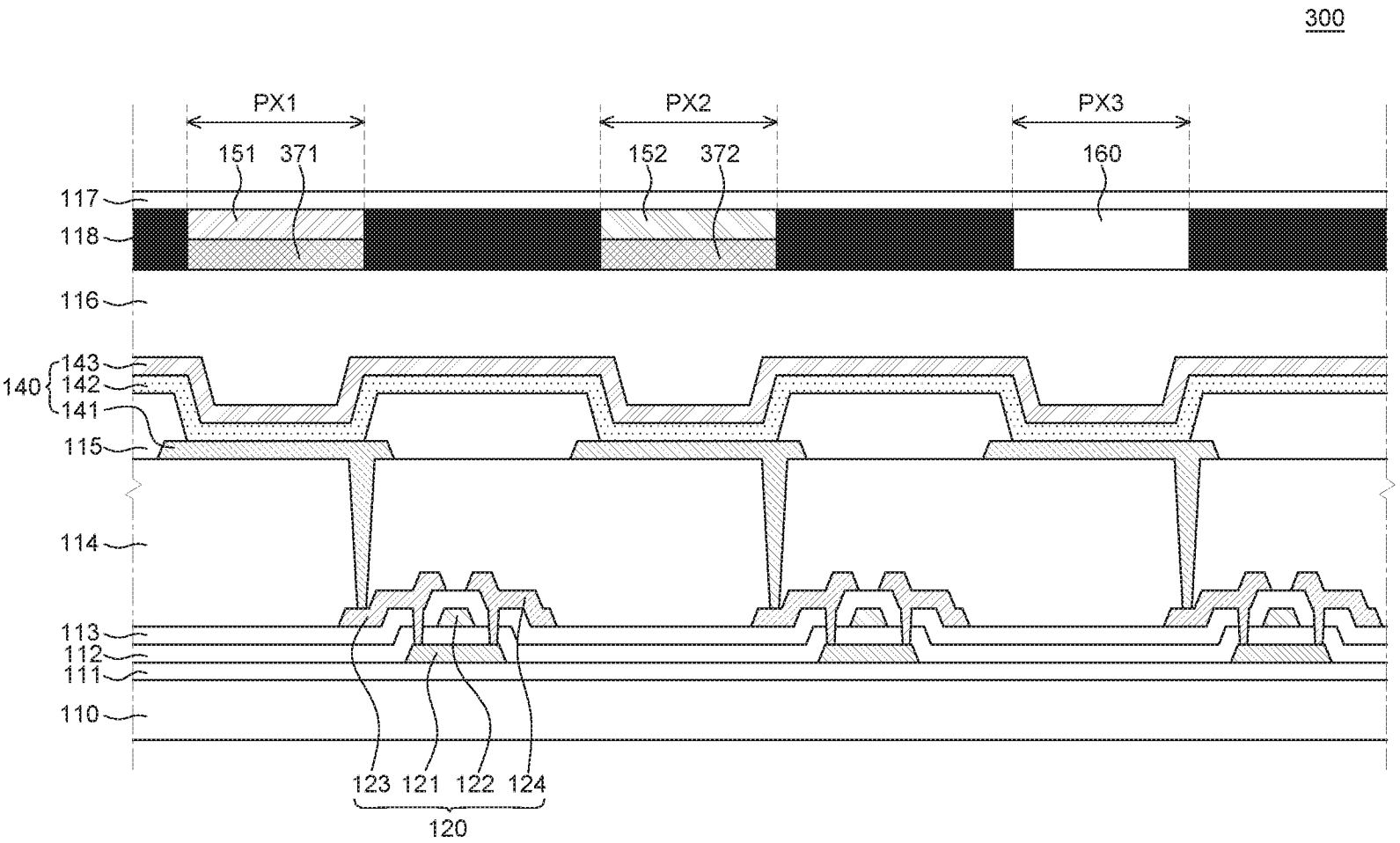
FIG. 3 is a cross-sectional view of a display device according to another embodiment of the present disclosure.

FIG. 3 is a cross-sectional view of a display device according to another embodiment of the present disclosure. A display device 300 illustrated in FIG. 3 is substantially the same as the display device 100 illustrated in FIG. 1 and FIG. 2 except that the display device 300 further includes a first auxiliary color filter 371 and a second auxiliary color filter 372. Thus, redundant explanation thereof will be omitted.

Referring to FIG. 3, the first auxiliary color filter 371 is disposed between the first color-conversion layer 151 and the organic light emitting diode 140. The first auxiliary color filter 371 is configured to reduce external light reflection from the first pixel PX1. The first auxiliary color filter 371 is disposed between the first color-conversion layer 151 and the encapsulation layer 116 in the first pixel PX1. A lateral surface of the first auxiliary color filter 371 can be in contact with a lateral surface of the black matrix 118.

The first auxiliary color filter 371 can be configured to transmit a blue light. That is, the first auxiliary color filter 371 may be a blue color filter. The first auxiliary color filter 371 as a blue color filter can transmit only light of a wavelength band corresponding to a blue light among incident light. That is, the first auxiliary color filter 371 can have a lower transmittance for other lights than for a blue light.

Specifically, the first auxiliary color filter 371 can transmit a third color light generated by the organic light emitting diode 140 and incident into the first auxiliary color filter 371, and the third color light incident from the first auxiliary color filter 371 can be incident into the first color-conversion layer 151. The third color light incident into the first color-conversion layer 151 can be converted into a first color light and then emitted to the outside of the display device 300.

Further, light incident into the first color-conversion layer 151 from the outside of the display device 300 can be converted into a first color light. The converted first color light can be incident from the first color-conversion layer 151 into the first auxiliary color filter 371. The first auxiliary color filter 371 is a blue color filter and thus can have a lower transmittance for other lights than for a blue light. Therefore, most of a first color light, that is, a red light, incident from the first color-conversion layer 151 into the first auxiliary color filter 371 is not transmitted by the first auxiliary color filter 371 (e.g., the red color 151 filter and the blue color filter 371 can work together to block most of the reflected light).

Furthermore, the second auxiliary color filter 372 is disposed between the second color-conversion layer 152 and the organic light emitting diode 140. The second auxiliary color filter 372 is configured to reduce external light reflection from the second pixel PX2. The second auxiliary color filter 372 is disposed between the second color-conversion layer 152 and the encapsulation layer 116 in the second pixel PX2. A lateral surface of the second auxiliary color filter 372 can be in contact with a lateral surface of the black matrix 118.

The second auxiliary color filter 372 can be configured to transmit a blue light. That is, the second auxiliary color filter 372 can be a blue color filter. The second auxiliary color filter 372 as a blue color filter can transmit only light of a wavelength band corresponding to a blue light among incident light. That is, the second auxiliary color filter 372 can have a lower transmittance for other lights than for a blue light.

Specifically, the second auxiliary color filter 372 can transmit a third color light generated by the organic light emitting diode 140 and incident into the second auxiliary color filter 372, and the third color light transmitted from the second auxiliary color filter 372 may be incident into the second color-conversion layer 152. The third color light incident into the second color-conversion layer 152 can be converted into a second color light and then emitted to the outside of the display device 300.

Further, light incident into the second color-conversion layer 152 from the outside of the display device 300 can be converted into a second color light. The converted second color light can be incident from the second color-conversion layer 152 into the second auxiliary color filter 372. The second auxiliary color filter 372 is a blue color filter and thus can have a lower transmittance for other lights than for a blue light. Therefore, most of a second color light, that is, a green light, incident from the second color-conversion layer 152 into the second auxiliary color filter 372 is not transmitted by the second auxiliary color filter 372 (e.g., the green color 152 filter and the blue color filter 372 can work together to block most of the reflected light).

The related art display device includes a polarizer on a second substrate to suppress external light reflection. The polarizer can polarize light incident from the outside of the display device. The polarized light incident into the display device through the polarizer may be reflected inside the display device and then phase-shifted. The phase-shifted light may not pass through the polarizer. Thus, light incident into the display device from the outside of the display device may not be output to the outside of the display device. Therefore, external light reflection of the display device can be reduced.

However, the related art display device includes the polarizer, and, thus, the thickness of the display device may be increased and the light efficiency may be reduced. The thickness of the display device may be increased by the thickness of the polarizer. Further, the polarizer can transmit only a wavelength oscillating in a specific direction, and, thus, only a specific light among light generated and emitted from the display device to the outside can pass through the polarizer. Therefore, the light efficiency of the display device can be reduced.

In contrast, the display device 300 according to an embodiment of the present disclosure includes the first auxiliary color filter 371 and the second auxiliary color filter 372 and thus can reduce external light reflection. Specifically, the first auxiliary color filter 371 can block the transmission of a first color light incident from the first color-conversion layer 151 into the first auxiliary color filter 371. The first color-conversion layer 151 can convert light incident from the outside of the display device 300 into a first color light, that is, a red light. Further, the red light can be incident into the first auxiliary color filter 371. The first auxiliary color filter 371 is a blue color filter and thus can have a higher transmittance for a blue light than for other lights. Thus, the red light incident from the first color-conversion layer 151 into the first auxiliary color filter 371 may not be incident into the encapsulation layer 116 (e.g., the red color 151 filter and the blue color filter 371 can work together to block most of the external light that is incident on the display device at PX1). Therefore, external light reflection caused by external light incident from the first pixel PX1 can be reduced.

Further, the second auxiliary color filter 372 can block the transmission of a second color light incident from the second color-conversion layer 152 into the second auxiliary color filter 372. The second color-conversion layer 152 can convert light incident from the outside of the display device 300 into a second color light, that is, a green light. Further, the green light can be incident into the second auxiliary color filter 372. The second auxiliary color filter 372 is a blue color filter and thus may have a higher transmittance for a blue light than for other lights. Thus, the green light incident from the second color-conversion layer 152 into the second auxiliary color filter 372 may not be incident into the encapsulation layer 116 (e.g., the green color 152 filter and the blue color filter 372 can work together to block most of the external light that is incident on the display device at PX2). Therefore, external light reflection caused by external light incident from the second pixel PX2 can be reduced.

Furthermore, the display device 300 according to another embodiment of the present disclosure includes the first auxiliary color filter 371 and the second auxiliary color filter 372 and thus may not include a polarizer. Therefore, the thickness of the display device 300 can be reduced and the light efficiency can be increased. Specifically, as described above, external light reflection of the display device 300 can be reduced by the first auxiliary color filter 371 and the second auxiliary color filter 372 without a polarizer. If the display device 300 includes a polarizer, the thickness may be increased and the light efficiency may be reduced as described above. Therefore, the display device 300 according to another embodiment of the present disclosure including the first auxiliary color filter 371 and the second auxiliary color filter 372 without a polarizer can be reduced in thickness and increased in light efficiency.

The display device 300 illustrated in FIG. 3 is of top-emission type, and, thus, light emitted from the organic light emitting diode 140 is emitted to the upper side of the display device 300. However, the display device 300 can also be of bottom-emission type. In this instance, light emitted from the organic light emitting diode is emitted toward a lower surface of the first substrate on which the transistor is formed. Further, the light emitted from the organic light emitting diode is emitted to the lower side of the organic light emitting diode, and the anode does not include the reflecting plate. The cathode can include the reflecting plate or may be formed of a metal material.

Further, if the display device illustrated in FIG. 3 is of bottom-emission type, the first color-conversion layer and the first auxiliary color filter can be disposed between the interlayer insulating layer and the overcoating layer in the first pixel. Specifically, in the first pixel, the first color-conversion layer can be disposed on the interlayer insulating layer and the first auxiliary color filter can be disposed on the first color-conversion layer. Further, the second color-conversion layer and the second auxiliary color filter can be disposed between the interlayer insulating layer and the overcoating layer in the second pixel. Specifically, in the second pixel, the second color-conversion layer can be disposed on the interlayer insulating layer and the second auxiliary color filter may be disposed on the second color-conversion layer. Furthermore, the transparent layer can be disposed between the interlayer insulating layer and the overcoating layer in the third pixel.

Figure 4:
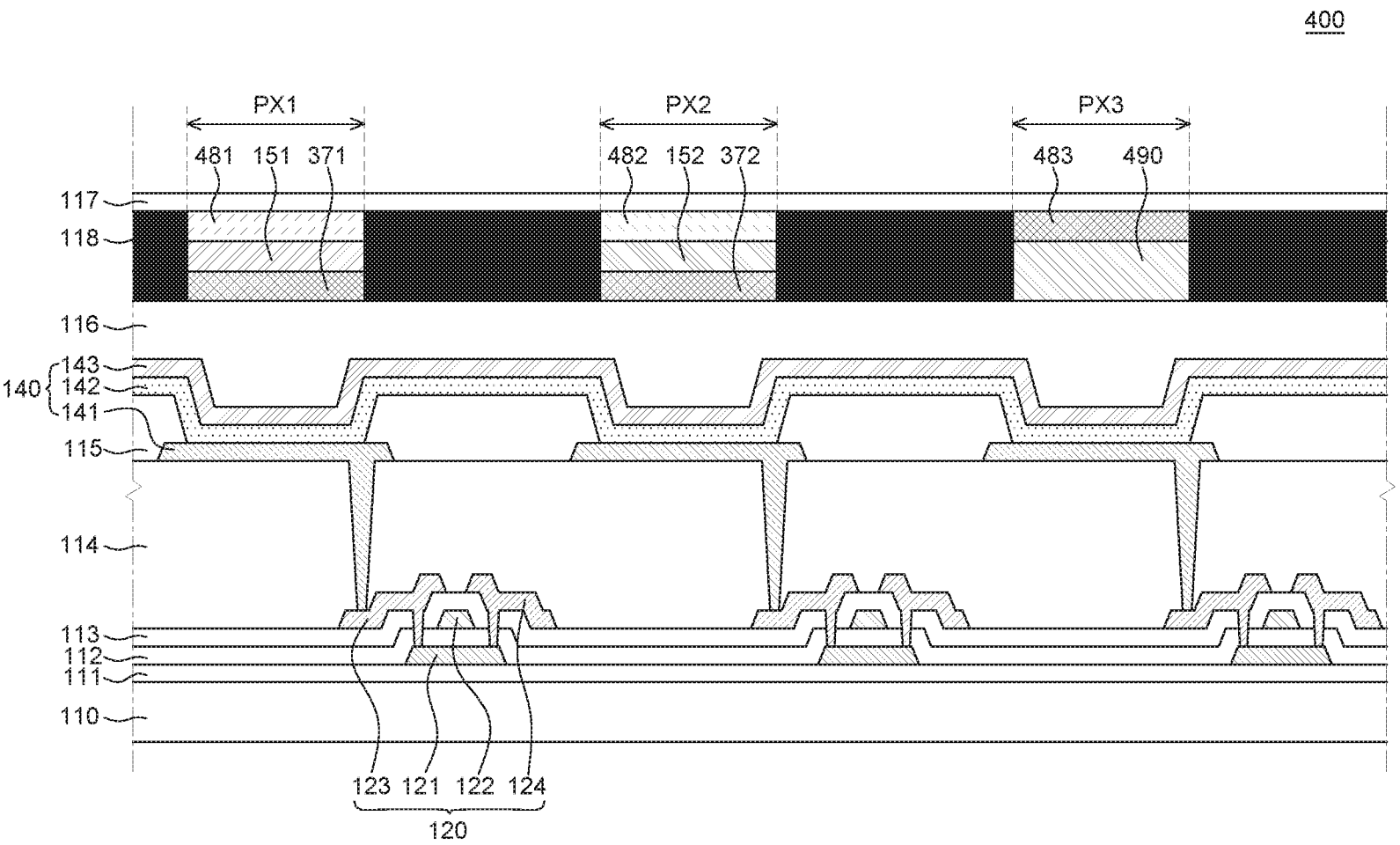
FIG. 4 is a cross-sectional view of a display device according to an embodiment of the present disclosure.

FIG. 4 is a cross-sectional view of a display device according to yet another embodiment of the present disclosure. A display device 400 illustrated in FIG. 4 is substantially the same as the display device 300 illustrated in FIG. 3 except that the display device 400 further includes a first color filter 481, a second color filter 482, a third color filter 483, and a light scattering layer 490. Thus, redundant explanation thereof will be omitted.

Referring to FIG. 4, the first color filter 481 is disposed on the first color-conversion layer 151. The first color filter 481 is configured to improve the color purity of the first pixel PX1. The first color filter 481 is disposed between the first color-conversion layer 151 and the second substrate 117 in the first pixel PX1. A lateral surface of the first color filter 481 is in contact with a lateral surface of the black matrix 118.

The first color filter 481 can be a red color filter. That is, the first color filter 481 can transmit a red light among light incident into the first color filter 481. Specifically, the first color filter 481 can contain a red dye or pigment. Therefore, the first color filter 481 can have a higher transmittance for light of a wavelength band corresponding to a red light than for light of other wavelength bands among light incident into the first color filter 481.

The first color filter 481 can suppress the transmission of other lights except a first color light among light incident from the first color-conversion layer 151. A third color light generated by the organic light emitting diode 140 can be transmitted by the first auxiliary color filter 371 and then converted into a first color light by the first color-conversion layer 151 (e.g., red quantum dot layer). Light emitted from the first color-conversion layer 151 can include a first color light and light of other wavelengths bands as the rest. The first color filter 481 as a red color filter can suppress the transmission of light of other wavelengths bands except the first color light. Therefore, the transmission of the light of other wavelengths bands except the first color light among the light emitted from the first color-conversion layer 151 can be suppressed by the first color filter 481.

Further, the second color filter 482 is disposed on the second color-conversion layer 152. The second color filter 482 is configured to improve the color purity of the second pixel PX2. The second color filter 482 is disposed between the second color-conversion layer 152 and the second substrate 117 in the second pixel PX2. A lateral surface of the second color filter 482 is in contact with a lateral surface of the black matrix 118.

The second color filter 482 can be a green color filter. That is, the second color filter 482 can transmit a green light among light incident into the second color filter 482. Specifically, the second color filter 482 can contain a green dye or pigment. Therefore, the second color filter 482 can have a higher transmittance for light of a wavelength band corresponding to a green light than for light of other wavelength bands among light incident into the second color filter 482.

The second color filter 482 can suppress the transmission of other lights except a second color light among light incident from the second color-conversion layer 152. A third color light generated by the organic light emitting diode 140 can be transmitted by the second auxiliary color filter 372 and then converted into a second color light by the second color-conversion layer 152. Light emitted from the second color-conversion layer 152 can include a second color light and light of other wavelengths bands as the rest. The second color filter 482 as a green color filter can suppress the transmission of light of other wavelengths bands except the second color light. Therefore, the transmission of the light of other wavelengths bands except the second color light among the light emitted from the second color-conversion layer 152 can be suppressed by the second color filter 482.

Further, the light scattering layer 490 is disposed on the organic light emitting diode 140 in the third pixel PX3. The light scattering layer 490 refers to a layer configured to scatter light emitted from the organic light emitting diode 140. The light scattering layer 490 is disposed on the encapsulation layer 116 in the third pixel PX3. A lateral surface of the light scattering layer 490 is in contact with a lateral surface of the black matrix 118.

The light scattering layer 490 can scatter a third color light generated by the organic light emitting diode 140. The light scattering layer 490 can include scattering particles. The scattering particles can be formed of titanium dioxide ($TiO_2$), but may not be limited thereto.

Specifically, the light scattering layer 490 can scatter anisotropic light incident into the light scattering layer 490 as isotropic light. The anisotropic light refers to light which varies in intensity depending on the direction of light. Further, the isotropic light refers to light which is uniform in intensity regardless of the direction of light. The scattering particles included in the light scattering layer 490 can convert anisotropic light, which is generated by the organic light emitting diode 140 and incident into the light scattering layer 490, into isotropic light. A third color light generated by the organic light emitting diode 140 can be anisotropic light which varies in intensity depending on the direction of light. The third color light as anisotropic light can be incident into the light scattering layer 490 and scattered by the light scattering layer 490 and then converted into isotropic light which is uniform in intensity regardless of the direction of light.

The third color filter 483 is disposed on the organic light emitting diode 140 in the third pixel PX3. The third color filter 483 is configured to improve the color purity of the third pixel PX3. The third color filter 483 is disposed between the light scattering layer 490 and the second substrate 117 in the third pixel PX3. A lateral surface of the third color filter 483 is in contact with a lateral surface of the black matrix 118.

The third color filter 483 can be a blue color filter. That is, the third color filter 483 can transmit a blue light among light incident into the third color filter 483. Specifically, the third color filter 483 can contain a blue dye or pigment. Therefore, the third color filter 483 can have a higher transmittance for light of a wavelength band corresponding to a blue light than for light of other wavelength bands among light incident into the third color filter 483.

The third color filter 483 can suppress the transmission of other lights except a third color light among light generated by the organic light emitting diode 140. A third color light generated by the organic light emitting diode 140 can be scattered as transmitted by the light scattering layer 490 and then incident into the third color filter 483. In this instance, the light generated by the organic light emitting diode 140 can include light of other wavelengths bands except a wavelength band corresponding to the third color light. The third color filter 483 as a blue color filter can suppress the transmission of light of other wavelengths bands except the third color light. Therefore, the transmission of the light of other wavelengths bands except the third color light included in the light generated by the organic light emitting diode 140 can be suppressed by the third color filter 483.

In the display device 400 illustrated in FIG. 4, the third color filter 483 is disposed on the light scattering layer 490. However, the positions of the third color filter 483 and the light scattering layer 490 are not limited thereto. For example, the third color filter 483 can be disposed under the light scattering layer 490. That is, the light scattering layer 490 may be disposed between the third color filter 483 and the second substrate 117, and the third color filter 483 can be disposed between the light scattering layer 490 and the encapsulation layer 116.

The display device 400 according to yet another embodiment of the present disclosure includes the first color filter 481, the second color filter 482, and the third color filter 483. Thus, the color purity of the display device 400 can be improved. The first color filter 481, the second color filter 482, and the third color filter 483 can suppress the transmission of other lights except a first color light, a second color light, and a third color light, respectively. Specifically, light transmitted by the first color-conversion layer 151 and incident into the first color filter 481 may include light of other wavelength bands except a wavelength band for a first color light. The first color filter 481 as a red color filter can suppress the transmission of the light of other wavelength bands except the wavelength band for the first color light.

Further, light transmitted by the second color-conversion layer 152 and incident into the second color filter 482 can include light of other wavelength bands except a wavelength band for a second color light. The second color filter 482 as a green color filter can suppress the transmission of the light of other wavelength bands except the wavelength band for the second color light.

Furthermore, light generated by the organic light emitting diode 140, transmitted by the light scattering layer 490 and incident into the third color filter 483 can include light of other wavelength bands except a wavelength band for a third color light. The third color filter 483 as a blue color filter can suppress the transmission of the light of other wavelength bands except the wavelength band for the third color light.

Therefore, in the first pixel PX1, the emission rate of the light of other wavelength bands except the wavelength band for the first color light can be reduced. In the second pixel PX2, the emission rate of the light of other wavelength bands except the wavelength band for the second color light can be reduced. Further, in the third pixel PX3, the emission rate of the light of other wavelength bands except the wavelength band for the third color light can be reduced. Thus, the color purity of the display device 400 according to yet another exemplary embodiment of the present disclosure can be improved.

Further, the display device 400 according to yet another embodiment of the present disclosure includes the light scattering layer 490 in the third pixel PX3. Thus, the viewing angle of the display device 400 can be improved. Specifically, the light scattering layer 490 scatters light incident into the light scattering layer 490 and converts anisotropic light into isotropic light. Therefore, light emitted from the third pixel PX3 can be isotropic light, and, thus, the viewing angle can be improved.

In addition, the display device 400 illustrated in FIG. 4 is of top-emission type, and, thus, light emitted from the organic light emitting diode 140 is emitted to the upper side of the display device 400. However, the display device 400 can also be of bottom-emission type. In this instance, light emitted from the organic light emitting diode is emitted toward a lower surface of the first substrate on which the transistor is formed. Further, the light emitted from the organic light emitting diode is emitted to the lower side of the organic light emitting diode, and the anode does not include the reflecting plate. The cathode can include the reflecting plate or may be formed of a metal material.

Further, if the display device illustrated in FIG. 4 is of bottom-emission type, the first color filter, the first color-conversion layer, and the first auxiliary color filter can be disposed between the interlayer insulating layer and the overcoating layer in the first pixel. Specifically, in the first pixel, the first color filter may be disposed on the interlayer insulating layer, the first color-conversion layer may be disposed on the first color filter, and the first auxiliary color filter can be disposed on the first color-conversion layer.

Further, the second color filter, the second color-conversion layer, and the second auxiliary color filter can be disposed between the interlayer insulating layer and the overcoating layer in the second pixel. Specifically, in the second pixel, the second color filter can be disposed on the interlayer insulating layer, the second color-conversion layer can be disposed on the second color filter, and the second auxiliary color filter can be disposed on the second color-conversion layer.

Furthermore, the third color filter and the light scattering layer can be disposed between the interlayer insulating layer and the overcoating layer in the third pixel. Specifically, in the third pixel, the third color filter can be disposed on the interlayer insulating layer and the light scattering layer may be disposed on the third color filter.

Figure 5A:
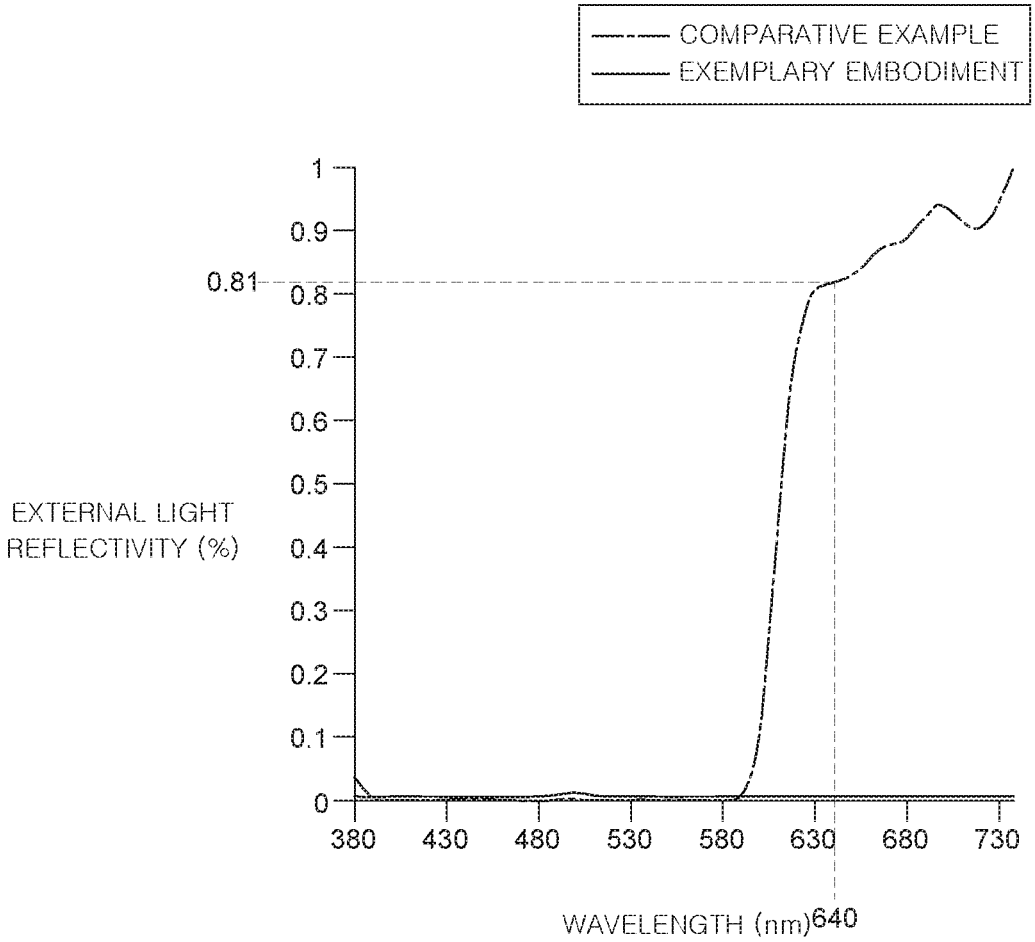
FIG. 5A and FIG. 5B illustrate graphs of external light reflectivity depending on the wavelength of light to illustrate the external light reflectivity of a display device according to an embodiment of the present disclosure.
Figure 5B:
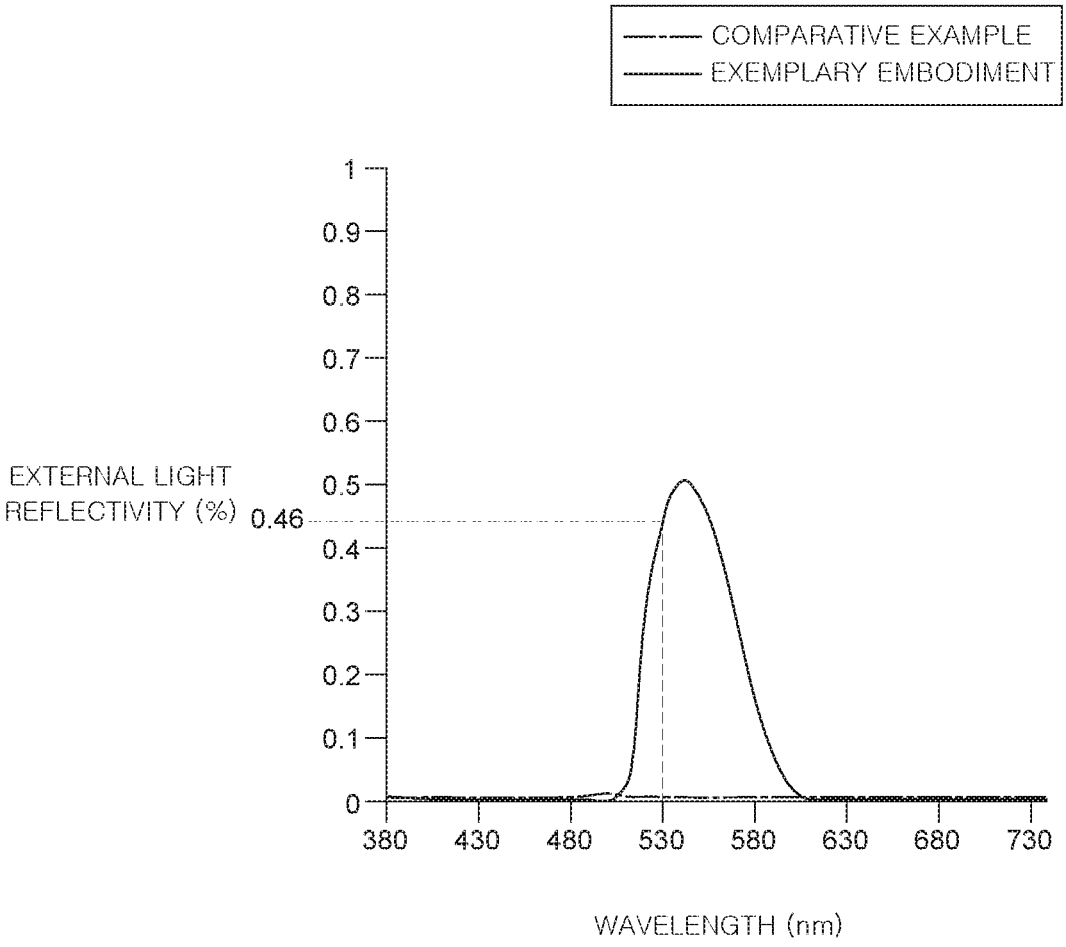

FIG. 5A and FIG. 5B illustrate graphs of external light reflectivity depending on the wavelength of light to explain the external light reflectivity of a display device according to an embodiment of the present disclosure.

The graphs in FIG. 5A and FIG. 5B illustrate the external light reflectivity of a display device according to an embodiment of the present disclosure illustrated in FIG. 4 and the external light reflectivity of a display device according to a comparative example. The display device according to the embodiment can be the display device 400 according to the embodiment of the present disclosure shown in FIG. 4.

The display device according to the comparative example does not include the first auxiliary color filter 371 and the second auxiliary color filter 372, as compared with the display device 400 illustrated in FIG. 4.

Light of various wavelength bands can be incident into a surface of the display device according to the embodiment and the display device according to the comparative example, respectively. The intensity of light after external light reflection with respect to incident light of each wavelength band can be measured. A ratio of the intensity of light after external light reflection to the intensity of incident light of each wavelength band can be calculated as external light reflectivity.

Referring to FIG. 5A, the external light reflectivity in the first pixel of the display device according to the embodiment and the external light reflectivity in the first pixel of the display device according to the comparative example can be seen. It can be seen that the display device according to the comparative example has a high external light reflectivity in a wavelength band for a red light. For example, the display device according to the comparative example has an external light reflectivity of 81% at a wavelength of 640 nm. In contrast, it can be seen that the display device according to the embodiment has a remarkably reduced external light reflectivity in a wavelength band for a red light. For example, the display device according to the embodiment has an external light reflectivity of 0.007% at a wavelength of 640 nm.

Therefore, referring to FIG. 5A, it can be seen that external light reflection with respect to light of a wavelength band corresponding to a red light is reduced by the first auxiliary color filter 371 included in the display device according to the embodiment.

Referring to FIG. 5B, the external light reflectivity in the second pixel of the display device according to the embodiment and the external light reflectivity in the second pixel of the display device according to the comparative example can be seen. It can be seen that the display device according to the comparative example has a high external light reflectivity in a wavelength band for a green light. For example, the display device according to the comparative example has an external light reflectivity of 46% at a wavelength of 530 nm. In contrast, it can be seen that the display device according to the embodiment has a remarkably reduced external light reflectivity in a wavelength band for a green light. For example, the display device according to the embodiment has an external light reflectivity of 0.02% at a wavelength of 530 nm.

Therefore, referring to FIG. 5B, it can be seen that external light reflection with respect to light of a wavelength band corresponding to a green light is reduced by the second auxiliary color filter 372 included in the display device according to the embodiment.

The example embodiments of the present disclosure can also be described as follows:

The display device according to embodiments of the present disclosure can also be described as follows:

According to an aspect of the present disclosure, a display device according to an embodiment of the present disclosure includes an organic light emitting diode which is disposed in a first pixel configured to emit a first color light, a second pixel configured to emit a second color light, and a third pixel configured to emit a third color light and emits the third color light. The display device further includes a first color-conversion layer disposed on the organic light emitting diode in the first pixel. The display device further includes a second color-conversion layer disposed on the organic light emitting diode in the second pixel. The first color light and the second color light can have a longer wavelength than the third color light.

According to another aspect of the present disclosure, the first color-conversion layer can convert the third color light into the first color light and the second color-conversion layer can convert the third color light into the second color light.

According to still another aspect, the display device can further include a first color filter disposed between the first color-conversion layer and the organic light emitting diode in the first pixel and configured to transmit the third color light, and a second color filter disposed between the second color-conversion layer and the organic light emitting diode in the second pixel and configured to transmit the third color light.

According to another aspect of the present disclosure, the display device can further include a third color filter disposed on the first color-conversion layer in the first pixel and configured to transmit the first color light.

According to another aspect of the present disclosure, the display device can further include a fourth color filter disposed on the second color-conversion layer in the second pixel and configured to transmit the second color light.

According to another aspect of the present disclosure, the display device can further include a fifth color filter disposed on the organic light emitting diode in the third pixel and configured to transmit the third color light.

According to another aspect of the present disclosure, the display device can further include a light scattering layer disposed on the organic light emitting diode in the third pixel.

According to another aspect of the present disclosure, a display device according to an embodiment of the present disclosure includes a blue organic light emitting diode disposed in a red pixel, a green pixel, and a blue pixel. The display device may further include a red color-conversion layer which is disposed on the blue organic light emitting diode in the red pixel and converts a blue light emitted from the blue organic light emitting diode into a red light. The display device may further include a green color-conversion layer which is disposed on the blue organic light emitting diode in the green pixel and converts a blue light emitted from the blue organic light emitting diode into a green light.

According to another aspect of the present disclosure, the display device can further include a first blue color filter disposed between the red color-conversion layer and the blue organic light emitting diode in the red pixel and a second blue color filter disposed between the green color-conversion layer and the blue organic light emitting diode in the green pixel.

According to another aspect of the present disclosure, the display device can further include a red color filter disposed on the red color-conversion layer in the red pixel.

According to another aspect of the present disclosure, the display device can further include a green color filter disposed on the green color-conversion layer in the green pixel.

According to another aspect of the present disclosure, the display device can further include a third blue color filter disposed on the organic light emitting diode in the blue pixel.

According to another aspect of the present disclosure, the display device can further include a light scattering layer disposed on the organic light emitting diode in the blue pixel.

Although the example embodiments of the present disclosure have been described in detail with reference to the accompanying drawings, the present disclosure is not limited thereto and can be embodied in many different forms without departing from the technical concept of the present disclosure. Therefore, the embodiments of the present disclosure are provided for illustrative purposes only but not intended to limit the technical spirit of the present disclosure. Therefore, it should be understood that the above-described embodiments are examples and illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

an organic light emitting diode disposed in a first pixel configured to emit a first color light, a second pixel configured to emit a second color light, and a third pixel configured to emit a third color light, wherein the organic light emitting diode emits the third color light;

a first color-conversion layer disposed on the organic light emitting diode in the first pixel;

a second color-conversion layer disposed on the organic light emitting diode in the second pixel;

a black matrix disposed between the first, second and third pixels; and a light scattering layer disposed only on the organic light emitting diode in the third pixel, wherein a lateral surface of the light scattering layer is in contact with the black matrix, and wherein the first color light and the second color light have a longer wavelength than the third color light.

2. The display device according to claim 1, wherein the organic light emitting diode *comprises a light emission layer that* is disposed *continuously* across the first, second and third pixels, and emits blue [monochromatic] light as the third color light.

3. The display device according to claim 1, wherein the first color-conversion layer converts the third color light into the first color light, and wherein the second color-conversion layer converts the third color light into the second color light.

4. The display device according to claim 3, wherein the first color-conversion layer includes red quantum dots and the second color-conversion layer includes green quantum dots.

5. The display device according to claim 1, further comprising:

a first auxiliary color filter disposed between the first color-conversion layer and the organic light emitting diode in the first pixel, wherein the first auxiliary color filter is configured to transmit the third color light; and a second auxiliary color filter disposed between the second color-conversion layer and the organic light emitting diode in the second pixel, wherein the second auxiliary color filter is configured to transmit the third color light.

6. The display device according to claim 5, wherein each of the first and second auxiliary color filters is a blue color filter.

7. The display device according to claim 1, further comprising:

a third color filter disposed on the first color-conversion layer in the first pixel, wherein the third color filter is configured to transmit the first color light received from the first color-conversion layer.

[8. The display device according to claim 7, wherein a top surface of the light scattering layer is in contact with the third color filter.]

9. The display device according to claim 1, further comprising:

a fourth color filter disposed on the second color-conversion layer in the second pixel, wherein the fourth color filter is configured to transmit the second color light received from the second color-conversion layer.

10. The display device according to claim 1, further comprising:

a fifth color filter disposed on the organic light emitting diode in the third pixel, wherein the fifth color filter is configured to transmit the third color light received from the organic light emitting diode.

11. The display device according to claim 1, wherein the organic light emitting diode has a n stack structure emitting a blue light, where n is a natural number greater than or equal to 2.

12. The display device according to claim 1, wherein the light scattering layer is configured to convert anisotropic light into isotropic light.

13. The display device according to claim 1, [further comprising:

a black matrix disposed between at least two of the first, second and third pixels,]

wherein a lateral side surface of the black matrix directly contacts a lateral side surface of one of the first or second color-conversion layers.

14. The display device according to claim 1, further comprising:

a transparent layer disposed in the third pixel and on a same layer as the first and second color-conversion layers, wherein the transparent layer is configured to pass the third color light emitted from the organic light emitting diode.

15. The display device according to claim 1, further comprising;

an encapsulation layer disposed on the organic light emitting diode, wherein a bottom surface of the light scattering layer is in contact with the encapsulation layer.

16. A display device, comprising:

a blue organic light emitting diode disposed in a red pixel, a green pixel, and a blue pixel;

a red color-conversion layer disposed on the blue organic light emitting diode in the red pixel, wherein the red color-conversion layer is configured to convert a blue light emitted from the blue organic light emitting diode into a red light;

a green color-conversion layer disposed on the blue organic light emitting diode in the green pixel, wherein the green color-conversion layer is configured to convert the blue light emitted from the blue organic light emitting diode into a green light;

a black matrix disposed between the red, green and blue pixels; and a light scattering layer disposed only on the blue organic light emitting diode in the blue pixel, wherein a lateral surface of the light scattering layer is in contact with the black matrix.

17. The display device according to claim 16, further comprising:

a first blue color filter disposed between the red color-conversion layer and the blue organic light emitting diode in the red pixel; and a second blue color filter disposed between the green color-conversion layer and the blue organic light emitting diode in the green pixel.

18. The display device according to claim 17, further comprising:

a third blue color filter disposed on the organic light emitting diode in the blue pixel.

19. The display device according to claim 16, further comprising:

a red color filter disposed on the red color-conversion layer in the red pixel.

20. The display device according to claim 16, further comprising:

a green color filter disposed on the green color-conversion layer in the green pixel.

21. A display device, comprising:

a red pixel, a green pixel and a blue pixel;

an organic light emitting diode including a blue organic emission layer configured to emit blue light, wherein the blue organic emission layer is disposed across the red, green and blue pixels;

a red color-conversion layer disposed in the red pixel, the red color-conversion layer being configured to convert the blue light emitted from the blue organic emission layer into a red light;

a green color-conversion layer disposed in the green pixel, the green color-conversion layer being configured to convert the blue light emitted from the blue organic emission layer into a green light;

a transparent layer disposed in the blue pixel, the transparent layer being configured to pass the blue light emitted from the blue organic emission layer;

a red color filter disposed in the red pixel;

a green color filter disposed in the green pixel;

a blue color filter disposed in the blue pixel;

a first blue auxiliary color filter disposed between the red color-conversion layer and the blue organic emission layer in the red pixel; [and]

a second blue auxiliary color filter disposed between the green color-conversion layer and the blue organic emission layer in the green pixel[.]; *and*

*a black matrix disposed between at least two of the red, green and blue pixels,*

*wherein a lateral side surface of the black matrix directly contacts a lateral side surface of at least one of the red color-conversion layer, the green color-conversion and the transparent layer, and* wherein the red, green and blue pixels do not overlap with a polarizer.

*22. The display device according to claim 10, wherein a top surface of the light scattering layer is in contact with the fifth color filter.*

*23. The display device according to claim 16, wherein the blue organic light emitting diode comprises a light emission layer that is disposed continuously across the red, green, and blue pixels.*

*24. The display device according to claim 1, wherein the display device does not include a polarizer.*

*25. The display device according to claim 16, wherein the display device does not include a polarizer.*

*26. A display device, comprising:*

*a light emitting element disposed in a first pixel configured to emit a first color light, a second pixel configured to emit a second color light, and a third pixel configured to emit a third color light;*

*a first color-conversion laver disposed on the light emitting element in the first pixel;*

*a second color-conversion laver disposed on the light emitting element in the second pixel;*

*a black matrix disposed between the first, second, and third pixels; and*

*a light scattering layer disposed only on the light emitting element in the third pixel,*

*wherein a lateral surface of the light scattering layer is in contact with the black matrix.*

*27. The display device according to claim 26, wherein the light emitting element is configured to emit a blue light.*

*28. The display device according to claim 26, wherein the light scattering layer comprises scattering particles.*

*29. The display device according to claim 28, wherein the scattering particles comprise titanium dioxide.*

*30. The display device according to claim 26, wherein the first color light is red, the second color light is green, and the third color light is blue.*

*31. The display device according to claim 26, wherein the first color light comprises a light having a wavelength in a range of from 600 nm to 640 nm, the second color light comprises a light having a wavelength in a range of from 520 nm to 580 nm, and the third color light comprises a light having a wavelength in a range of from 400 nm to 480 nm.*

*32. The display device according to claim 26, wherein the light emitting element comprises:*

*a first electrode;*

*a second electrode; and*

*a light emission layer disposed between the first electrode and the second electrode.*

*33. The display device according to claim 32, wherein the light emission layer comprises a single emission layer.*

*34. The display device according to claim 32, wherein the light emission layer comprises a plurality of emission layers.*

*35. The display device according to claim 34, wherein the plurality of emission layers comprise a first emission layer and a second emission layer,*

*wherein the light emission layer further comprises a charge generation layer disposed between the first emission layer and the second emission layer.*

*36. The display device according to claim 35, wherein the first emission layer and the second emission layer are configured to emit the third color light.*

*37. The display device according to claim 32, wherein the first electrode comprises at least one of ytterbium, indium tin oxide, indium zinc oxide, indium tin zinc oxide, zinc oxide, and tin oxide.*

*38. The display device according to claim 32, wherein the second electrode comprises at least one of indium tin oxide, indium zinc oxide, and indium tin zinc oxide.*

*39. The display device according to claim 32, wherein the second electrode comprises a reflecting plate.*

*40. The display device according to claim 32, wherein the light emission layer further comprises at least one of a hole transport layer, an electron transport layer, a hole block layer, an electron block layer, a hole injection layer, and an electron injection layer.*

*41. The display device according to claim 32, further comprising a pixel defining layer disposed on the second electrode, wherein the black matrix overlaps the pixel defining layer.*

*42. The display device according to claim 26, wherein the first color-conversion layer is configured to convert the third color light into the first color light, and*

*wherein the second color-conversion layer is configured to convert the third color light into the second color light.*

*43. The display device according to claim 26, further comprising:*

*a first color filter disposed on the first color-conversion layer in the first pixel;*

*a second color filter disposed on the second color-conversion layer in the second pixel; and*

*a third color filter disposed on the light emitting element in the third pixel, wherein the third color filter is configured to transmit the third color light.*

*44. The display device according to claim 43, further comprising:*

*a fourth color filter disposed in the first pixel, wherein the fourth color filter is configured transmit a color light different from the first color filter; and*

*a fifth color filter disposed in the second pixel, wherein the fifth color filter is configured transmit a color light different from the second color filter.*

*45. The display device according to claim 44, wherein at least a portion of the fourth color filter overlaps the first color filter and the first color-conversion layer in the first pixel, and*

*wherein at least a portion of the fifth color filter overlaps the second color filter and the second color-conversion layer in the second pixel.*

*46. The display device according to claim 44, wherein the fourth color filter and the fifth color filter are configured to transmit the third color light.*

*47. The display device according to claim 43, wherein the first color filter in the first pixel, the second color filter in the second pixel, and the third color filter in the third pixel are spaced apart from each other.*

*48. The display device according to claim 26, wherein the light scattering layer is configured to convert anisotropic light into isotropic light.*

*49. The display device according to claim 26, wherein a lateral surface of each of the first and second color-conversion layers contacts the black matrix.*

*50. The display device according to claim 26, further comprising;*

*an encapsulation layer disposed between the light emitting element and the first and second color-conversion layers and between the light emitting element and the black matrix.*

*51. The display device according to claim 50, wherein the encapsulation layer comprises at least one inorganic layer and at least one organic layer.*

*52. The display device according to claim 51, wherein the at least one inorganic layer and the at least one organic layer are laminated alternately.*

*53. The display device according to claim 26, wherein the black matrix comprises a first black matrix layer disposed between the first color-conversion layer and the second color conversion layer.*

*54. The display device according to claim 53, wherein a thickness of the first black matrix layer is equal to a thickness of at least one of the first color-conversion layer and the second color conversion layer.*

*55. The display device according to claim 53, wherein the black matrix further comprises a second black matrix layer disposed between a first color filter disposed on the first color-conversion layer in the first pixel and a second color filter disposed on the second color-conversion layer in the second pixel.*

*56. The display device according to claim 26, wherein the display device does not include a polarizer.*

*57. The display device according to claim 56, wherein the polarizer is configured to polarize light incident into the display device for reducing external light reflection.*

*58. The display device according to claim 56, wherein the display device has a reduced thickness and improved light efficiency by omission of the polarizer relative to another display device that includes the polarizer.*

*59. The display device according to claim 26, wherein the first color-conversion layer includes first color quantum dots and the second color-conversion layer includes second color quantum dots.*

*60. The display device according to claim 26, wherein the light emitting element comprises a light emission layer that is disposed continuously across the first, second, and third pixels.*

* * * * *